United States Patent
Kang et al.

(10) Patent No.: US 10,211,808 B2
(45) Date of Patent: Feb. 19, 2019

(54) ACOUSTIC WAVE FILTER DEVICE AND PACKAGE AND METHOD OF MANUFACTURING THE SAME

(71) Applicant: Samsung Electro-Mechanics Co., Ltd., Suwon-si (KR)

(72) Inventors: Yun Sung Kang, Suwon-si (KR); Pil Joong Kang, Suwon-si (KR); Kwang Su Kim, Suwon-si (KR); Ji Hye Nam, Suwon-si (KR); Jeong Suong Yang, Suwon-si (KR); Jeong Il Lee, Suwon-si (KR); Jong Hyeong Song, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 73 days.

(21) Appl. No.: 15/276,986

(22) Filed: Sep. 27, 2016

(65) Prior Publication Data

US 2017/0230032 A1    Aug. 10, 2017

(30) Foreign Application Priority Data

Feb. 4, 2016 (KR) .......................... 10-2016-0014261

(51) Int. Cl.
| | |
|---|---|
| *H03H 9/10* | (2006.01) |
| *H03H 9/56* | (2006.01) |
| *H03H 9/64* | (2006.01) |
| *H03H 3/02* | (2006.01) |
| *H03H 3/08* | (2006.01) |

(52) U.S. Cl.
CPC ............ *H03H 9/1014* (2013.01); *H03H 3/02* (2013.01); *H03H 3/08* (2013.01); *H03H 9/1071* (2013.01); *H03H 9/56* (2013.01); *H03H 9/64* (2013.01)

(58) Field of Classification Search
CPC .. H03H 9/1014; H03H 9/1042; H03H 9/1071; H03H 3/08; H03H 9/56; H03H 9/64; H03H 9/02
USPC ................................ 333/133, 187, 193–196
See application file for complete search history.

(56) References Cited

U.S. PATENT DOCUMENTS

| | | | |
|---|---|---|---|
| 2006/0131731 A1 | 6/2006 | Sato | |
| 2007/0176250 A1 | 8/2007 | Lee et al. | |
| 2009/0134957 A1 | 5/2009 | Shin | |

(Continued)

FOREIGN PATENT DOCUMENTS

| | | |
|---|---|---|
| JP | 2006-173557 A | 6/2006 |
| JP | 2008-98831 A | 4/2008 |
| JP | 2008-292312 A | 12/2008 |

(Continued)

OTHER PUBLICATIONS

Japanese Office Action dated Dec. 26, 2017 in the corresponding Japanese Patent Application No. 2016-207270 (9 pages in English, 3 pages in Japanese).

*Primary Examiner* — Robert J Pascal
*Assistant Examiner* — Jorge L Salazar, Jr.
(74) *Attorney, Agent, or Firm* — NSIP Law

(57) ABSTRACT

An acoustic wave filter device includes a base having an acoustic wave filter part and a bonding part disposed thereon, the bonding part surrounding the acoustic wave filter part, and a cap having a bonding counterpart disposed thereon, the bonding counterpart being bonded to the bonding part of the base, and the bonding part includes a first bonding layer including gold, and the bonding counterpart includes a second bonding layer bonded to the first bonding layer and including tin.

24 Claims, 6 Drawing Sheets

(56) References Cited

U.S. PATENT DOCUMENTS

2014/0083735 A1   3/2014   Kohda et al.

FOREIGN PATENT DOCUMENTS

| KR | 10-2007-0016855 A | 2/2007 |
| KR | 10-0731351 B1 | 6/2007 |
| KR | 10-2009-0055073 A | 6/2009 |
| WO | WO 2012/128210 A1 | 9/2012 |

ACOUSTIC WAVE FILTER DEVICE AND PACKAGE AND METHOD OF MANUFACTURING THE SAME

CROSS-REFERENCE TO RELATED APPLICATIONS

This application claims benefit under 35 USC 119(a) of Korean Patent Application No. 10-2016-0014261 filed on Feb. 4, 2016 in the Korean Intellectual Property Office, the entire disclosure of which is incorporated herein by reference for all purposes.

BACKGROUND

1. Field

The following description relates to an acoustic wave filter device and a package for manufacturing the same.

2. Description of Related Art

Recently, devices using bulk acoustic wave (BAW) filters have played a very important role in realizing miniaturization, multifunctionalization, and improvements in the performance of wireless communications devices and systems. In order to provide optimal performance characteristics of a BAW filter device, a hermetic seal capable of maintaining reliable sealing of the BAW filter in a vacuum state so as to block the penetration of moisture is required.

A silicon-silicon (Si—Si) direct bonding technology, a silicon-glass (Si-Glass) anodic bonding technology, and a bonding technology using flit glass are examples of wafer-level bonding technologies that are currently used at a time of manufacturing a BAW filter device for maintaining a hermetic seal of a BAW filter of the device. However, these technologies are not generally appropriate for a package of the BAW filter device due to a high bonding temperature or bad workability. Accordingly, there is a desire for improved technologies for hermetically sealing a BAW filter in a BAW filter device that provide, for example, high oxidation resistance and excellent mechanical characteristics such as high fracture toughness.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave filter device includes a base having an acoustic wave filter part and a bonding part disposed thereon, the bonding part surrounding the acoustic wave filter part, and a cap having a bonding counterpart disposed thereon, the bonding counterpart being bonded to the bonding part of the base, and the bonding part includes a first bonding layer including gold, and the bonding counterpart includes a second bonding layer bonded to the first bonding layer and including tin.

A thickness of the first bonding layer may be equal to or greater than 1.2 times a thickness of the second bonding layer and equal to or less than 2 times the thickness of the second bonding layer.

A thickness of the first bonding layer may be in a range of approximately 1.5 μm to 3 μm.

The bonding counterpart may include an auxiliary bonding layer disposed beneath the second bonding layer and formed of gold.

The bonding part may include a first adhesive layer disposed on the base.

The first adhesive layer may include chromium or titanium.

The bonding counterpart may include a second adhesive layer disposed on the cap.

The second adhesive layer may include chromium or titanium.

The cap may include a groove to accommodate the acoustic wave filter part therein.

The first bonding layer and the second bonding layer may be bonded to each other by heat and pressure applied thereto.

The first bonding layer and the second bonding layer may be bonded to each other in a temperature environment of 280° C. to 350° C.

In another general aspect, a package for manufacturing an acoustic wave filter device includes a base wafer having acoustic wave filter parts and bonding parts disposed thereon, the bonding parts surrounding the acoustic wave filter parts, and a cap wafer having bonding counterparts disposed thereon, the bonding counterparts bonded to the corresponding bonding parts of the base wafer. The bonding parts include a first bonding layer including gold, and the bonding counterparts include a second bonding layer includes tin and bonded to the first bonding layer.

A thickness of the first bonding layer may be equal to or greater than 1.2 times a thickness of the second bonding layer and equal to or less than 2 times the thickness of the second bonding layer.

A thickness of the first bonding layer may be 1.5 μm to 3 μm.

The cap wafer may include at least one groove formed therein and disposed at a position corresponding to at least one of the acoustic wave filter parts.

The first bonding layer and the second bonding layer may be bonded to each other by pressure applied to the first bonding layer and the second bonding layer in a temperature range of 280° C. to 350° C.

In another general aspect, a method of manufacturing an acoustic wave filter device involves forming a bonding part to surround an acoustic wave filter on a base wafer, the bonding part including a first metal; forming a bonding counterpart on a cap wafer, the bonding counterpart including a second metal; and bonding the bonding part and the bonding counterpart. An alloy of the first metal and the second metal forms at an interface between the bonding part and the bonding counterpart.

The alloy may include at least one selected from a group consisting of $Au_5Sn$, $AuSn$, and $AuSn_2$.

The bonding of the bonding part and the bonding counterpart may be performed in a temperature range of 280° C. to 350° C.

The forming of the bonding counterpart may involve forming a stack of a first bonding layer including the first metal and a second bonding layer including the second metal, and a ratio of a thickness of the first bonding layer to a combined thickness of the first bonding layer and the second bonding layer may be in a range of approximately 1/40 to 1/20.

A thickness of the bonding part may be equal to or greater than 1.2 times a thickness of the bonding counterpart and equal to or less than 2 times the thickness of the bonding counterpart.

In yet another general aspect, an acoustic wave filter device includes a base including an acoustic wave filter, a cap covering the acoustic wave filter disposed on the base, and a bonding structure by which the cap is bonded to the base, and the bonding structure includes a first bonding layer of a first metal disposed on the base and a second bonding layer of a second metal disposed on the cap, and an alloy of the first metal and the second metal disposed at an interface between the first bonding layer and the second bonding layer.

The alloy may include at least one selected from a group consisting of $Au_5Sn$, $AuSn$, and $AuSn_2$.

The bonding structure may further include a third bonding layer of the first metal disposed between the second bonding layer and the cap.

The first metal may be gold, and the second metal may be tin.

The cap may include a groove aligned with the acoustic wave filter part in a space formed within the base, the cap and the bonding structure. An area of the groove may decrease from a bottom of the groove to a top of the groove.

A ratio of a thickness of the first bonding layer to a combined thickness of the first bonding layer and the second bonding layer may be in a range of approximately 1/40 to 1/20.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
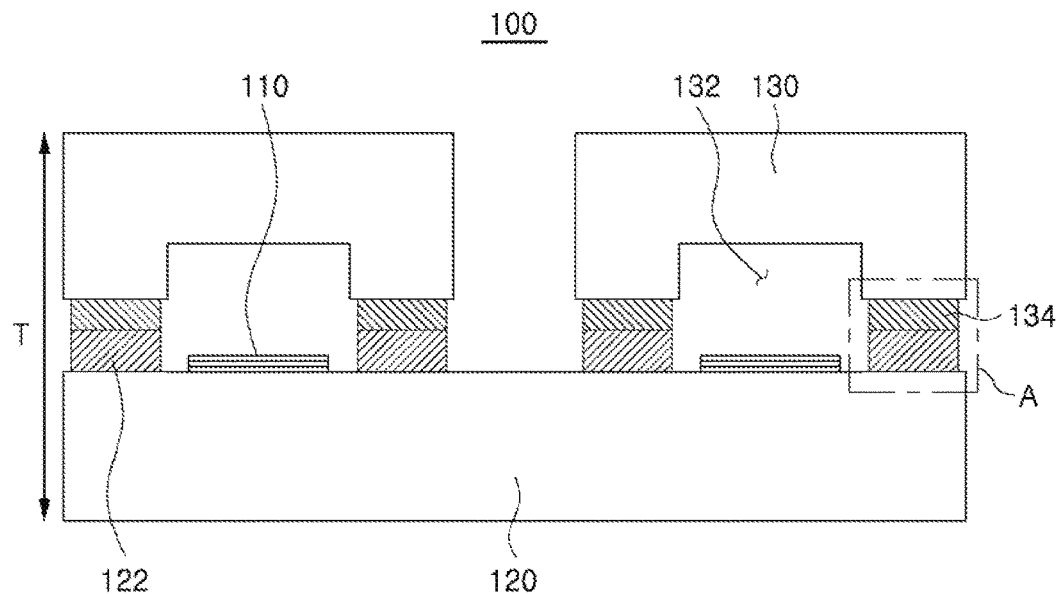
FIG. 1 is a cross-sectional view illustrating an example of an acoustic wave filter device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

As used herein, the term "and/or" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
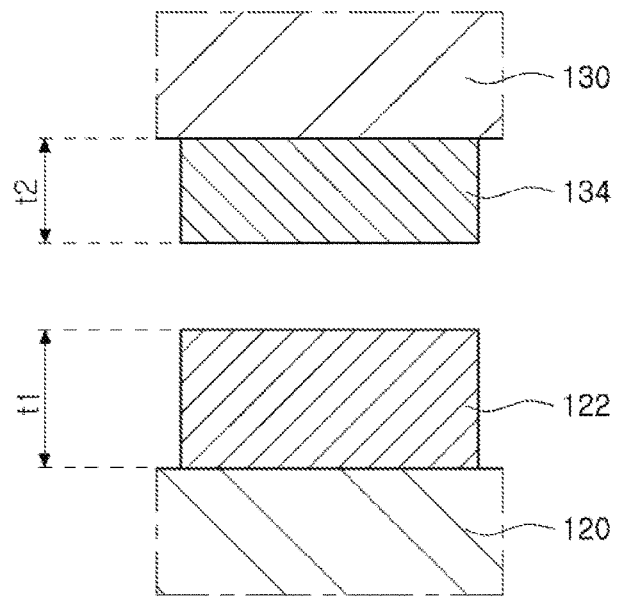
FIG. 2 is an exploded view of illustrating part A of an example of the acoustic wave filter device according to FIG. 1.

FIG. 1 illustrates a cross-sectional view of an example of an acoustic wave filter device 100. FIG. 2 illustrates an exploded view of part A of the acoustic wave filter device 100 illustrated in FIG. 1.

Referring to FIGS. 1 and 2, the acoustic wave filter device 100 includes an acoustic wave filter part 110, a base 120, and a cap 130 by way of example.

In this example, the acoustic wave filter part 110 is formed on the base 120. Further, the acoustic wave filter part 110 includes a lower electrode, a piezoelectric body, and an upper electrode. The piezoelectric body includes a piezoelectric material that may be manufactured using a thin film, such as zinc oxide (ZnO) or aluminum nitride (AlN), for example.

In this example, the acoustic wave filter part 110 includes a bulk acoustic wave (BAW) filter. However, the acoustic wave filter part 110 is not limited to including a BAW filter, and may include another type of acoustic wave filter, such as a surface acoustic wave (SAW) filter or a stack crystal filter (SCF).

The acoustic wave filter part 110 is disposed on one surface of the base 120, and a bonding part 122 is formed to surround the acoustic wave filter part 110. The base 120 may be obtained by dicing a base wafer 420 (FIG. 7) into multiple pieces as described below. According to one example, the bonding part 122 is formed on an upper surface of the base 120 so as to enclose an area surrounding the acoustic wave filter part 110.

In this example, the bonding part 122 has a quadrangular band shape, and is formed to have a greater height than a height of the acoustic wave filter part 110 along a thickness direction T of the acoustic wave filter device 100. However, in another example, the shape and height of the bonding part 122 may be varied. The bonding part 122 may be formed of gold (Au). However, the present disclosure is not limited thereto. In another example, the bonding part 122 is not limited to being entirely formed of gold (Au), and may be formed of a material that contains gold (Au) and other metal or substance.

The bonding part 122 may be formed of a single bonding layer or multiple bonding layers. Referring to the example illustrated in FIG. 1, the bonding part 122 comprises of a first bonding layer, which is a single bonding layer. In the cap 130 that covers the base 120, a depression groove 132 is formed above the acoustic wave filter part 110 to hermetically seal a space surrounding the acoustic waver filter part 110. A bonding counterpart 134 that mates with the bonding part 122 is provided along a rim, or perimeter area, of the cap 130. In this example, the acoustic wave filter part 110 is disposed below the depression groove 132 when the cap 130 is bonded to the base 120. During this process, the bonding counterpart 134 of the cap 130 is stacked above the bonding part 122 of the base, so that a bonding structure obtained by joining the bonding part 122 and the bonding counterpart 134 surrounds the acoustic wave filter part 110 and encloses the acoustic wave filter part 110 therein.

That is, the base 120 and the cap 130 are bonded to each other by bonding the bonding part 122 and the bonding counterpart 134 to each other. Accordingly, the base 120, the bonding part 122, the bonding counterpart 134 and the cap 130 together form a hermetically sealed interior space in which the wave filter part 110 is accommodated.

Furthermore, the depression groove 132 is formed so that an area of the depression groove 132 narrows or decreases from the bottom of the depression groove 132 to the top of the depression groove.

In addition, the bonding counterpart 134 also has a quadrangular band shape, and is formed of a second boding layer that is formed of tin (Sn), for example. However, the bonding counterpart 134 is not limited to being formed of tin (Sn), and may also be formed of a material containing tin (Sn).

The bonding part 122 and the bonding counterpart 134 are, for example, bonded to each other by diffusion-bonding. However, other bonding processes may be used to bond the bonding part 122 and the bonding counterpart 134 to each other.

Referring to FIG. 2, in one embodiment, a thickness t1 of the bonding part 122 in the thickness direction T (FIG. 1) is equal to or greater than 1.2 times the thickness t2 of the bonding counterpart 134 in the thickness direction T, and may be equal to or less than two times the thickness t2 of the bonding counterpart 134. That is, the ratio of the thickness t1 of the first bonding layer to the thickness t2 of the second bonding layer is equal to or greater than 1.2, and is equal to or less than 2.

According to one example, the thickness t1 of the first bonding layer may be, for example, approximately 1.5 to 3 µm.

The bonding part 122 and the bonding counterpart 134 are bonded to each other at a bonding temperature and pressure. According to one example, a bonding temperature of approximately 280° C. to 350° C. is applied in order to obtain an inter-diffusion bonding of the bonding part 122 and the bonding counterpart 134. For instance, gold (Au) and tin (Sn) may form a plurality of alloys, including $Au_5Sn$, AuSn, $AuSn_2$. Among these alloys, a bonding structure formed with $Au_5Sn$ and AuSn exhibits excellent physical characteristics and reliability. By using a bonding temperature of approximately 280° C. to 350° C., a bonding structure with excellent physical characteristics and reliability may be obtained.

According to one example, the bonding counterpart 134 of the cap 130 is made of tin (Sn) while the bonding part 122 is made of gold (Au). Since gold (Au) is expensive in comparison to tin (Sn), the use of tin (Sn) rather than gold (Au) in forming the bonding counterpart 134 reduces manufacturing costs. Further, according to one example, to obtain a reliable bonding of the bonding part 122 to the bounding counterpart 134, a sufficient amount of tin (Sn) is secured while bonding materials are being diffused. The amount of tin (Sn) consumed in the formation of a gold-tin (Au—Sn) intermetallic compound during a temperature rise section of the bonding process may be reduced in order to secure an adequate amount of melted tin (Sn) contributing to the bonding between the bonding part 122 and the bonding counterpart 134. That is, the production of gold-tin (Au—Sn) intermetallic compound during a time period in which the temperature is raising may be suppressed, such that an amount of melted tin (Sn) actually contributing to the bonding between the bonding part 122 and the bonding counterpart 134 may be increased.

In the event that gold (Au) or a noble metal is stacked on a surface of the second bonding layer of the bonding counterpart 134 in order to prevent oxidation of the bonding metal, as soon as the temperature of the bonding material increases in order to bond the bonding part 122 and the bonding counterpart 134 to each other, the gold (Au) stacked on the surface of the second bonding layer of the bonding counterpart 134 and the tin (Sn) react to each other and produces an intermetallic compound having a high melting temperature. Due to the high melting temperature of the intermetallic compound, the intermetallic compound solidifies while the base 120 and the cap 130 being pressed to complete the bonding process. Therefore, pores may form due to empty spaces between the bonding surfaces of the base 120 and the cap 130. The pores may reduce the reliability of an acoustic wave filter device by allowing moisture and other contaminants to enter the sealed interior space around the acoustic wave filter part 110. Thus, according to an example of the present disclosure, gold (Au) or noble metal is not formed on a surface of the second bonding layer to prevent corrosion.

According to an example of the present disclosure, an amount of gold (Au) contained in the bonding counterpart 134 of the cap 130 is reduced, and an amount of tin (Sn) contained in the bonding counterpart 134 is increased, such that the probability that tin (Sn) is exhausted while a temperature of the boding materials are being increased is reduced, whereby an amount of tin (Sn) actually contributing to the bonding between the bonding part 122 and the bonding counterpart 134 may be relatively increased. As a result, a dense bonding structure in which pores are not formed at the interface between the bounding part 122 and the bonding counterpart 134 may be obtained.

Therefore, moisture and other impurities may be kept from entering an interspace accommodating the acoustic wave filter part 110, and an acoustic wave filter device 100 exhibiting excellent oxidation resistance may be obtained. Further, the bonding structure thus obtained may exhibit excellent mechanical characteristics such as fracture toughness in subsequent manufacturing process.

Additional examples of an acoustic wave filter device will be described with reference to FIGS. 3 through 6.

Figure 3:
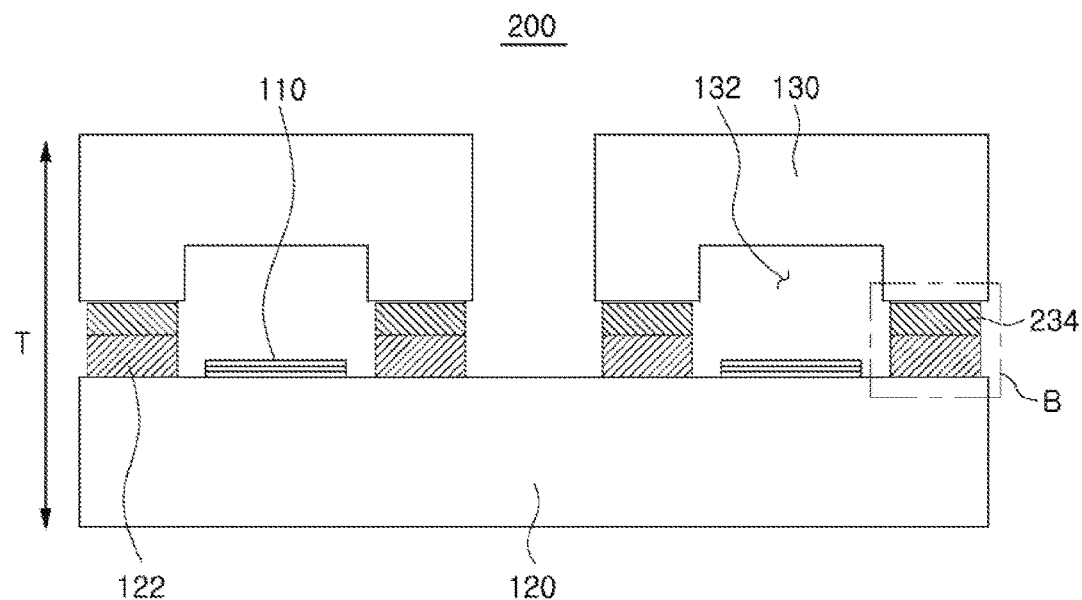
FIG. 3 is a cross-sectional view illustrating an example of an acoustic wave filter device.
Figure 4:
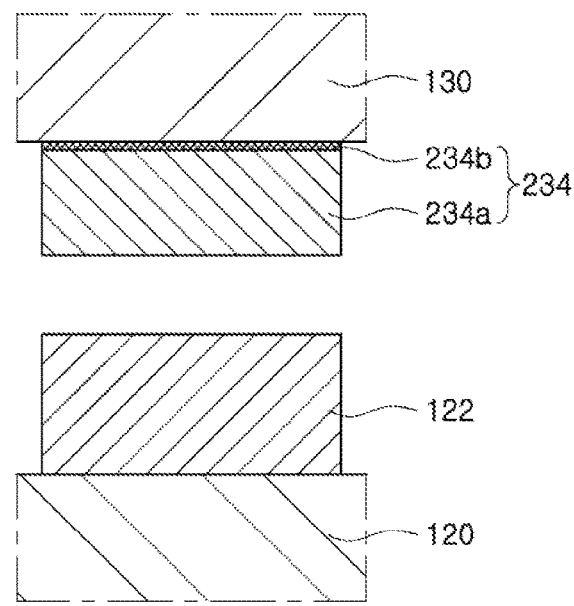
FIG. 4 is a magnified view illustrating part B of an example of the acoustic wave filter device according to FIG. 3.

FIG. 3 illustrates a cross-sectional view of an example of an acoustic wave filter device 200. FIG. 4 is a magnified view illustrating part B of the acoustic wave filter device illustrated in FIG. 3.

Referring to FIGS. 3 and 4, an acoustic wave filter device 200 includes the acoustic wave filter part 110, the base 120, and the cap 130. Since the acoustic wave filter part 110, the base 120, and the cap 130 are the same the corresponding components in the acoustic wave filter device 100, a detailed description of these components will not be repeated. The acoustic wave filter device 200 differs from the acoustic wave filter device 100 only in that the acoustic wave filter device 200 includes a bonding counterpart 234 instead of the bonding counterpart 134.

The bonding counterpart 234 has a quadrangular band shape. The bonding counterpart 234 includes a second bonding layer 234a and an auxiliary bonding layer 234b formed above the second bonding layer 234a, between the second bonding layer 234a and the cap 130. For example, second bonding layer 234a is formed of tin (Sn), and the auxiliary bonding layer 234b is formed of gold (Au).

The bonding part 122 and the bonding counterpart 234 are bonded to each other at a predetermined bonding temperature (approximately 280° C. to 350° C., for example) and pressure.

In addition, a ratio of a thickness of the gold (Au) layer in the bonding counterpart 234 may be approximately 1/40 to 1/20 to the combined thickness of the gold (Au) layer and the tin (Sn) layer, such that an adequate amount of melted tin (Sn) contributes to the bonding between the bonding part 122 and the bonding counterpart 234. That is, the probability that the tin (Sn) layer would be completely consumed as a gold-tin (Au—Sn) intermetallic compound is formed while the temperature is increasing is reduced. In other words, production of the gold-tin (Au—Sn) intermetallic compound in the temperature rise section is suppressed, such that an amount of melted tin (Sn) actually contributing to the bonding between the bonding part 122 and the bonding counterpart 234 is increased.

In the event that gold (Au) or a noble metal is stacked on a surface of the second bonding layer 234a of the bonding counterpart 234 in order to prevent oxidation, when a temperature is increased in order to bond the bonding part 122 and the bonding counterpart 234 to each other, the gold (Au) stacked on the surface of the second bonding layer of the bonding counterpart 234 and the tin (Sn) of the second bonding layer 234a of the bonding counterpart 234 react to each other in the temperature rise section to produce an intermetallic compound having a high melting temperature. The intermetallic compound may be present in a solid state without being melted at the time of contacting and being bonded to the bonding part 122 of the base 120. Therefore, pores may remain at the interface area of the bonding part 122 and the bonding counterpart 234 due to an empty space between bonded surfaces. Thus, according to an example of the present disclosure, gold (Au) or noble metal is not formed on a surface of the second bonding layer 234a of the bonding counterpart 234 to prevent corrosion.

Rather, according to an example of the present disclosure, an amount of tin (Sn) contained in the bonding counterpart 234 of the cap is increased by reducing an amount of gold (Au) contained in the bonding counterpart 234 in order to reduce the chance that tin (Sn) may become exhausted due to rapid diffusion and intermetallic compound formation while the temperature is being raised to reach the bonding temperature. Since tin (Sn) has a lower melting temperature, tin (Sn) tends to diffuse faster than gold (Au) or other noble metal. In this example, an amount of tin (Sn) actually contributing to the bonding between the bonding part 122 and the bonding counterpart 234 is greater in comparison to a case in which the bonding counterpart 234 is substantially formed of gold (Au). By ensuring that a shortage of tin (Sn) does not occur during the bonding process, it is possible to obtain a dense bonding structure without pores at the interface between the bonding part 122 and the bonding counterpart 234.

Therefore, the acoustic wave filter device 200 has excellent oxidation resistance, and excellent mechanical characteristics such as fracture toughness.

Figure 5:
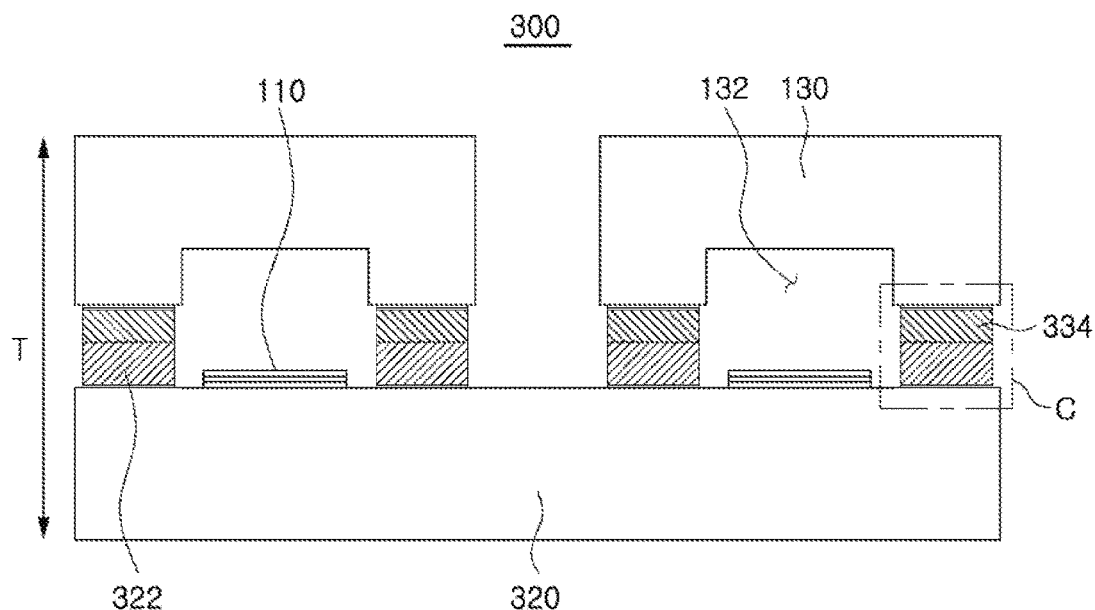
FIG. 5 is a cross-sectional view illustrating an example of an acoustic wave filter device.
Figure 6:
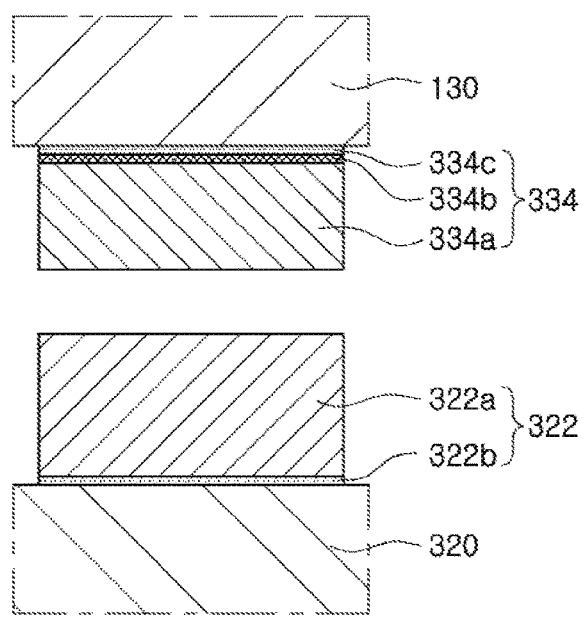
FIG. 6 is a magnified view illustrating part C of an example of the acoustic wave filter device of FIG. 5.

FIG. 5 illustrates a cross-sectional view of an example of an acoustic wave filter device 300. FIG. 6 illustrates a magnified view of part C of FIG. 5.

Referring to FIGS. 5 and 6, the acoustic wave filter device 300 includes the acoustic wave filter part 110, a base 120, and the cap 130. However, the acoustic wave filter device 300 differs from the acoustic wave filter devices 100 and 200 in that the acoustic wave filter device 300 includes a bonding part 322 and a bonding counterpart 334.

In an embodiment, the bonding part 322 has a quadrangular band shape, and is formed at a height in the thickness direction T that is higher than a height of the acoustic wave filter part 110. The bonding part 322 includes a first bonding layer 322a and a first adhesive layer 322b formed below the first bonding layer 322a, between the first bonding layer 322a and the base 120.

The first bonding layer 322a is formed of gold (Au), for example, and the first adhesive layer 322b formed beneath the first bonding layer 322a is formed of chromium (Cr) or titanium (Ti), for example. However, the first bonding layer 322a and the first adhesive layer 322b are not limited to being formed of the materials described above. For example, the first bonding layer 322a may be formed of a material containing gold (Au), and the first adhesive layer 322b may be formed of a material containing chromium (Cr) or titanium (Ti).

The bonding counterpart 334 has a quadrangular band shape. The bonding counterpart 334 includes a second bonding layer 334a, an auxiliary bonding layer 334b formed above the second bonding layer 334a, and a second adhesive layer 334c formed above the auxiliary bonding layer 334b, between the second bonding layer 334a and the cap 130. The second bonding layer 334a may be formed of tin (Sn), the auxiliary bonding layer 334b may be formed of gold (Au), and the second adhesive layer 334c may be formed of chromium (Cr) or titanium (Ti).

Figure 7:
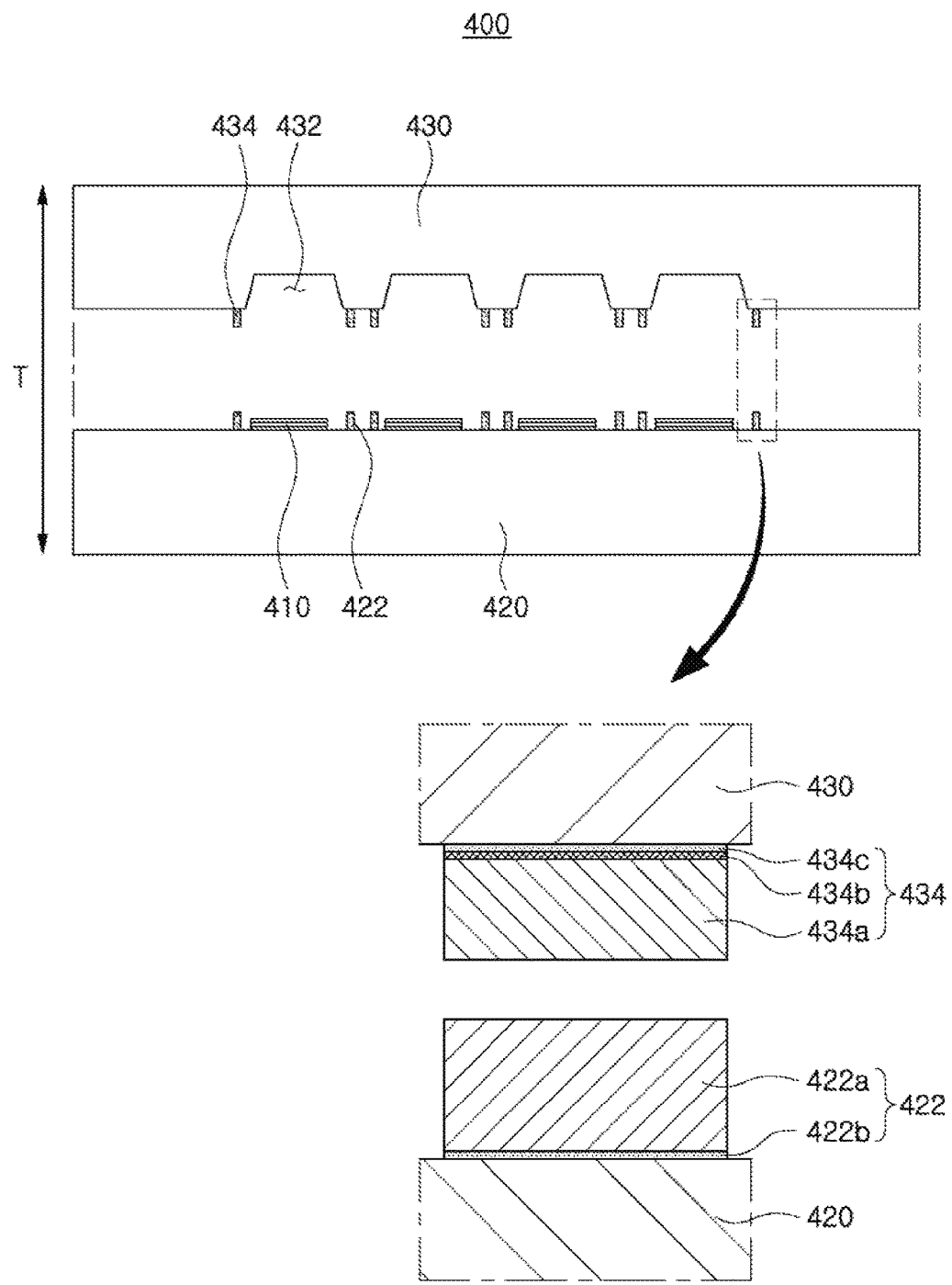
FIG. 7 is a cross-sectional view illustrating an example of a package for manufacturing an acoustic wave filter device and a magnified view of a portion of the package.
Figure 8:
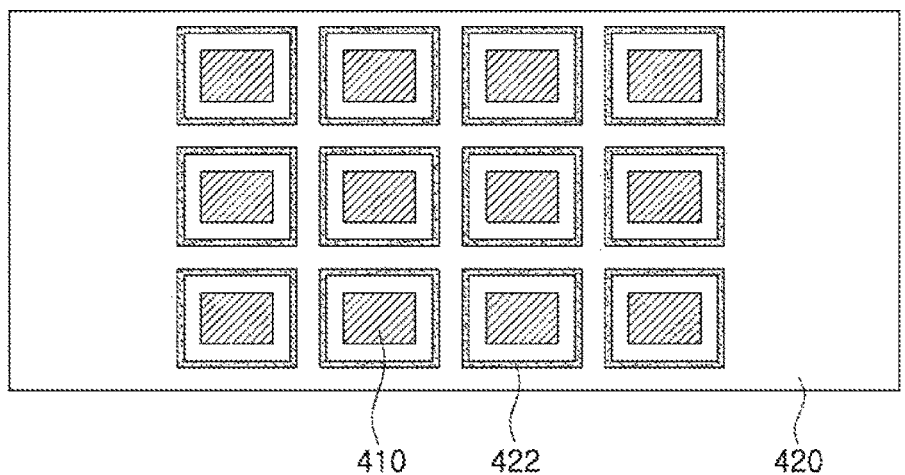
FIG. 8 is a plan view illustrating an example of a base wafer included in a package for manufacturing an acoustic wave filter device.
Figure 9:
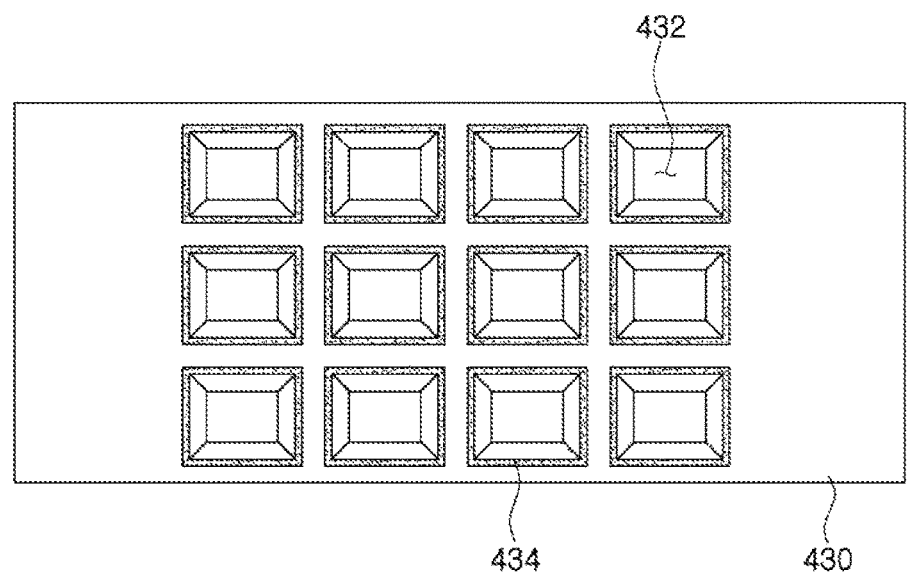
FIG. 9 is a bottom view illustrating an example of a cap wafer included in a package for manufacturing an acoustic wave filter device.

FIG. 7 illustrates a cross-sectional view of an example of a package 400 for manufacturing an acoustic wave filter device. FIG. 8 is a plan view illustrating an example of a base wafer 420 included in the package 400. FIG. 9 is a bottom view illustrating an example of a cap wafer 430 included in the package 400.

Referring to FIGS. 7 through 9, the package 400 for manufacturing an acoustic wave filter device includes one or more acoustic wave filter parts 410, a base wafer 420, and a cap wafer 430.

The one or more acoustic wave filter parts 410 are formed on the base wafer 420. That is, as illustrated in FIG. 8, acoustic wave filter parts 410 may be formed on the base wafer 420 to in a configuration of columns and rows.

Although not illustrated in detail in FIGS. 7 through 9, each of the acoustic wave filter parts 410 may include a lower electrode, a piezoelectric body, and an upper electrode. The piezoelectric body includes a piezoelectric material that may be manufactured using a thin film such as zinc oxide (ZnO) or aluminum nitride (AlN), for example.

The acoustic wave filter part 410 is formed of a bulk acoustic wave (BAW) filter. However, the acoustic wave filter part 410 is not limited to a BAW filter, and, alternatively, may be a surface acoustic wave (SAW) filter, or a stack crystal filter (SCF).

The acoustic wave filter parts 410 may be formed on one surface of the base wafer 420, and bonding parts 422 respectively surround the acoustic wave filter parts 410. The bonding parts 422 may have a lattice shape. That is, the acoustic wave filter parts 410 may be formed at central portions of areas surrounded by the respective bonding parts 422 having the lattice shape. Further, a height of the bonding part 422 is greater than a thickness of the acoustic wave filter part 410 in the thickness direction T.

The bonding part 422 includes a first bonding layer 422a and a first adhesive layer 422b formed beneath the first bonding layer 422a, between the first bonding layer 422a and the base wafer 420. The first bonding layer 422a is bonded to the base wafer 420 through the first adhesive layer 422b For example, the first bonding layer 422a is formed of gold (Au), and the first adhesive layer 422b is formed of chromium (Cr) or titanium (Ti). However, the first bonding layer 422a and the first adhesive layer 422b are not limited to being formed of the materials described above. In another embodiment, the first bonding layer 422a may be formed of a material containing gold (Au), and the first adhesive layer 422b may be formed of a material containing chromium (Cr) or titanium (Ti).

According to another embodiment, the bonding part 422 may not include the first adhesive layer 422b. That is, the bonding part 422 may include the first bonding layer 422a bonded directly to the base wafer 420, without the first adhesive layer 422b.

Depression grooves 432 are formed in the cap wafer 430 at positions corresponding to the acoustic wave filter parts 410, and bonding counterparts 434 corresponding to the bonding parts 422 are formed beneath the cap wafer 430. More specifically, the acoustic wave filter parts 410 are disposed below the depression grooves 432 at the time of bonding the base wafer 420 and the cap wafer 430 to each other. In addition, each of the bonding parts 422 and the bonding counterparts 434 surround a respective acoustic wave filter part 410 so as to enclose the respective acoustic wave filter part 410 in an interior space defined by the base wafer 420, the bonding part 422, the bonding counterpart 434 and the cap wafer 430. In other words, the bonding counterparts 434 may also have a lattice shape, and the depression grooves 432 may be formed at central portions of areas surrounded by the bonding counterparts 434. The depression groove 432 may be formed so that an area of the depression groove 432 narrows from the bottom of the depression groove 432 to the top of the depression groove 432.

The bonding counterpart 434 includes a second bonding layer 434a, an auxiliary bonding layer 434b formed above the second bonding layer 434a, and a second adhesive layer 434c formed above the auxiliary bonding layer 434b, between the auxiliary bonding layer 434b and the cap wafer 430. For example, the second bonding layer 434a is formed of tin (Sn), the auxiliary bonding layer 434b is formed of gold (Au), and the second adhesive layer 434c is formed of chromium (Cr) or titanium (Ti). According to other embodiments, the bonding counterpart 434 may only include the second bonding layer 434a bonded directly to the cap wafer 430, or the bonding counterpart 434 may include the second bonding layer 434a and the auxiliary bonding layer 434b bonded directly to the cap wafer 430, without the second adhesive layer 434c.

The bonding part 422 and the bonding counterpart 434 are bonded to each other at a predetermined bonding temperature (approximately 280° C. to 350° C., for example) and pressure.

In addition, as described above with respect to the embodiments of FIGS. 1-6, a ratio of the thickness of the gold (Au) layer in the bonding counterpart 434 of the cap wafer 430 to the combined thickness of the gold (Au) and the tin (Sn) layer may range between approximately 1/40 to 1/20, such that an adequate amount of melted tin (Sn) contributes to the bonding between the bonding part 422 and the bonding counterpart 434. Thus, the probability that tin (Sn) would be exhausted due to rapid diffusion and formation of a gold-tin (Au—Sn) intermetallic compound while the temperature is being raised to complete the bonding process may be reduced. In other words, the production of the gold-tin (Au—Sn) intermetallic compound is suppressed while the temperature is being raised, and an amount of melted tin (Sn) actually contributing to the bonding between the bonding part 422 and the bonding counterpart 434 is increased.

In more detail, in a case in which gold (Au) or a noble metal of the first bonding layer 422a of the bonding part 422 is stacked on a surface of the second bonding layer 434a of the bonding counterpart 434 in order to prevent oxidation, when a temperature is elevated in order to bond the bonding part 422 and the bonding counterpart 434 to each other, the gold (Au) of the first bonding layer 422a of the bonding part 422 and the tin (Sn) of the second bonding layer of the bonding counterpart 434 react to each other in the temperature rise section to produce an intermetallic compound having a high melting temperature. The intermetallic compound may be present in a solid state without being melted at the time of contacting and being bonded to the bonding part 422 of the base wafer 420. Therefore, it is possible for pores to remain due to an empty space between bonded surfaces.

However, according to an example of the present disclosure, an amount of tin (Sn) contained in the bonding counterpart 434 is increased to reduce an amount of gold (Au) contained in the bonding counterpart 434 of the cap wafer 430, such that a probability that the tin (Sn) layer is exhausted while the temperature is being increased to the bonding temperature is reduced, and an amount of tin (Sn) actually contributing to the bonding between the bonding part 422 and the bonding counterpart 434 is increased. As a result, dense bonded surfaces without pores may be formed.

The acoustic wave filter device 100, 200 or 300 may be manufactured by dicing the package 400.

Figure 10:
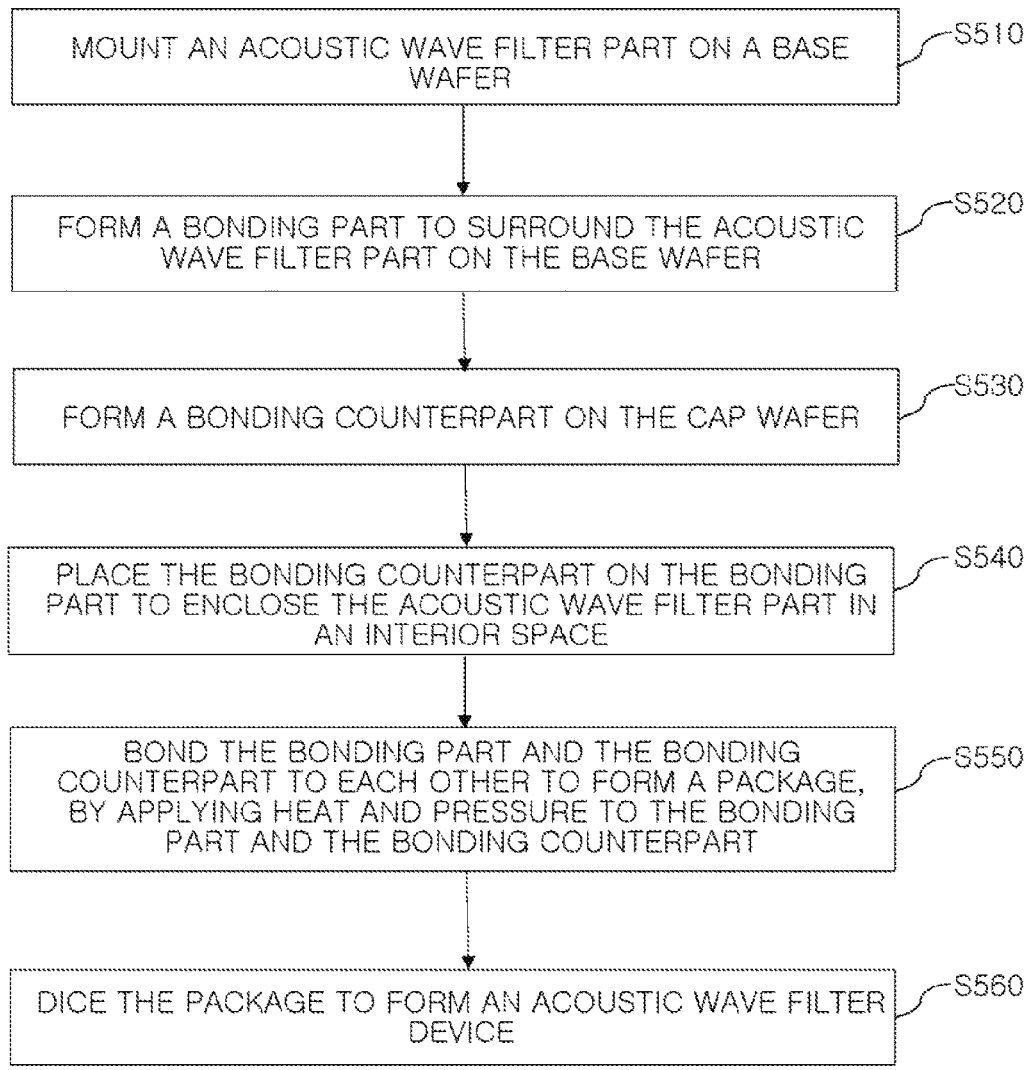
FIG. 10 is a flow chart illustrating an example of a method of manufacturing an acoustic wave filter device.

FIG. 10 illustrates and example method of manufacturing an acoustic wave filter device, such as the device 100, 200 or 300. As shown in FIG. 10, in operation S510, an acoustic wave filter part (e.g., the acoustic wave filter part 410) is mounted on a surface (e.g., an upper surface) of a base wafer (e.g., the base wafer 420). In operation S520, a bonding part (e.g., the bonding part 122, 322 or 422) is formed on the surface of the base wafer such that the bonding part surrounds the base wafer. For example, the bonding part is formed of a material including gold (Au).

In operation S530, a bonding counterpart (e.g., the bonding counterpart 134, 234, 334 or 434) is formed on a lower surface of a cap wafer (e.g., the cap wafer 430) including a depression groove (e.g., the depression groove 432). For example, the bonding counterpart is formed of a material including tin (Sn). Thereafter, in operation S540, the bonding counterpart is placed on the bonding part and the cap wafer is positioned such that the depression groove is aligned with the acoustic wave filter part, and the acoustic wave filter part is enclosed in an interior space formed by the base wafer, the bonding part, the bonding counterpart and the cap wafer.

In operation S550, the bonding part and the bonding counterpart are bonded to each other to form a package, by applying a bonding temperature and a bonding pressure to the bonding part and the bonding counterpart. The bonding is performed such that production of a gold-tin (Au—Sn) intermetallic compound in the temperature rise section, corresponding to an interface area of the bonding part and the bonding counterpart, is suppressed, and such that an adequate amount of melted tin (Sn) contributing to the bonding between the bonding part and the bonding counterpart is provided, thereby resulting in dense bonded surfaces on which pores are not formed. In operation S560, the package is diced to form the acoustic wave filter device.

As set forth above, according to the embodiments disclosed herein, an acoustic wave filter device may have excellent oxidation resistance and excellent mechanical characteristics such as fracture toughness, or the like While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter device, comprising:
   a base having an acoustic wave filter part and a bonding part disposed thereon, the bonding part surrounding the acoustic wave filter part; and
   a cap having a bonding counterpart disposed thereon, the bonding counterpart being bonded to the bonding part of the base,
   wherein the bonding part comprises a first bonding layer comprising gold, and
   wherein the bonding counterpart comprises
      a second bonding layer bonded to the first bonding layer and comprising tin, and
      an auxiliary bonding layer disposed between the second bonding layer and the cap, and consisting essentially of gold.

2. The acoustic wave filter device of claim 1, wherein a thickness of the first bonding layer is equal to or greater than 1.2 times a thickness of the second bonding layer and equal to or less than 2 times the thickness of the second bonding layer.

3. The acoustic wave filter device of claim 1, wherein a thickness of the first bonding layer is in a range of approximately 1.51 µm to 3 µm.

4. The acoustic wave filter device of claim 1, wherein the cap comprises a groove to accommodate the acoustic wave filter part therein.

5. The acoustic wave filter device of claim 1, wherein the bonding part comprises a first adhesive layer disposed on the base.

6. The acoustic wave filter device of claim 5, wherein the first adhesive layer comprises chromium or titanium.

7. The acoustic wave filter device of claim 1, wherein the bonding counterpart comprises a second adhesive layer disposed on the cap.

8. The acoustic wave filter device of claim 7, wherein the second adhesive layer comprises chromium or titanium.

9. The acoustic wave filter device of claim 1, wherein the first bonding layer and the second bonding layer are bonded to each other by heat and pressure applied thereto.

10. The acoustic wave filter device of claim 9, wherein the first bonding layer and the second bonding layer are bonded to each other in a temperature environment of 280° C. to 350° C.

11. A package for manufacturing an acoustic wave filter device, the package comprising:
   a base wafer having acoustic wave filter parts and bonding parts disposed thereon, the bonding parts surrounding the acoustic wave filter parts; and
   a cap wafer having bonding counterparts disposed thereon, the bonding counterparts bonded to the corresponding bonding parts of the base wafer,
   wherein the bonding parts comprise a first bonding layer comprising gold, and wherein the bonding counterparts comprise
a second bonding layer bonded to the first bonding layer and comprising tin, and
an auxiliary bonding layer disposed between the second bonding layer and the cap water, and consisting essentially of gold.

12. The package of claim 11, wherein the first bonding layer and the second bonding layer are bonded to each other by pressure applied to the first bonding layer and the second bonding layer in a temperature range of 280° C. to 350° C.

13. The package of claim 11, wherein a thickness of the first bonding layer is equal to or greater than 1.2 times a thickness of the second bonding layer and equal to or less than 2 times the thickness of the second bonding layer.

14. The package of claim 11, wherein a thickness of the first bonding layer is 1.5 μm to 3 μm.

15. The package of claim 11, wherein the cap wafer comprises at least one groove formed therein and disposed at a position corresponding to at least one of the acoustic wave filter parts.

16. A method of manufacturing an acoustic wave filter device, the method comprising:
forming a bonding part to surround an acoustic wave filter on a base wafer, the bonding part comprising a first metal;
forming a bonding counterpart on a cap wafer, the bonding counterpart comprising a second metal; and
bonding the bonding part and the bonding counterpart such that an alloy of the first metal and the second metal forms at an interface between the bonding part and the bonding counterpart,
wherein the forming of the bonding counterpart comprises forming a stack of a first bonding layer comprising the first metal and a second bonding layer comprising the second metal, and
wherein a ratio of a thickness of the first bonding layer to a combined thickness of the first bonding layer and the second bonding layer is in a range of approximately 1/40 to 1/20.

17. The method of claim 16, wherein a thickness of the bonding part is equal to or greater than 1.2 times a thickness of the bonding counterpart and equal to or less than 2 times the thickness of the bonding counterpart.

18. The method of claim 16, wherein the alloy comprises at least one selected from a group consisting of $Au_5Sn$, AuSn and $AuSn_2$.

19. The method of claim 16, wherein the bonding of the bonding part and the bonding counterpart is performed in a temperature range of 280° C. to 350° C.

20. An acoustic wave filter device, comprising:
a base comprising an acoustic wave filter;
a cap covering the acoustic wave filter disposed on the base; and
a bonding structure by which the cap is bonded to the base,
wherein the bonding structure comprises a first bonding layer of a first metal disposed on the base and a second bonding layer of a second metal disposed on the cap, and an alloy of the first metal and the second metal disposed at an interface between the first bonding layer and the second bonding layer, and
wherein a ratio of a thickness of the first bonding layer to a combined thickness of the first bonding layer and the second bonding layer is in a range of approximately 1/40 to 1/20.

21. The acoustic wave filter device of claim 20, wherein the alloy comprises at least one selected from a group consisting of $Au_5Sn$, AuSn and $AuSn_2$.

22. The acoustic wave filter device of claim 20, wherein the bonding structure further comprises a third bonding layer of the first metal disposed between the second bonding layer and the cap.

23. The acoustic wave filter device of claim 22, wherein the first metal is gold, and the second metal is tin.

24. The acoustic wave filter device of claim 20, wherein:
the cap comprises a groove aligned with the acoustic wave filter part in a space formed within the base, the cap and the bonding structure; and
an area of the groove decreases from a bottom of the groove to a top of the groove.

* * * * *